United States Patent

Stewart

[11] 3,947,727
[45] Mar. 30, 1976

[54] PROTECTION CIRCUIT FOR INSULATED-GATE FIELD-EFFECT TRANSISTORS

[75] Inventor: Roger Green Stewart, Neshanic Station, N.J.

[73] Assignee: RCA Corporation, New York, N.Y.

[22] Filed: Dec. 10, 1974

[21] Appl. No.: 531,394

[52] U.S. Cl. ............ 317/31; 317/33 VR; 330/207 P
[51] Int. Cl.² ............................................. H02H 3/20
[58] Field of Search ............... 317/31, 33 R, 33 UR; 330/207 P; 357/41

[56] References Cited
UNITED STATES PATENTS

| | | | |
|---|---|---|---|
| 3,395,290 | 7/1968 | Farina et al. | 357/41 |
| 3,769,572 | 10/1973 | Doubt | 317/33 VR X |

FOREIGN PATENTS OR APPLICATIONS

| | | | |
|---|---|---|---|
| 1,906,200 | 9/1969 | Germany | 317/31 |

Primary Examiner—J. D. Miller
Assistant Examiner—Harry E. Moose, Jr.
Attorney, Agent, or Firm—H. Christoffersen; H. I. Schanzer

[57] ABSTRACT

Two current-carrying paths are connected in parallel between a signal input terminal and an internal node to which are connected the gate electrodes of insulated-gate field-effect transistors to be protected. One path includes the conduction path of a first transistor of one conductivity type connected in series with a first diode poled in a direction to charge the internal node and the other path includes the conduction path of a second transistor of second conductivity type in series with a second diode poled in a direction to discharge the internal node. The control electrodes of the first and second transistors are connected to points of operating potential rendering the first transistor conductive in the source follower mode for input signals of one polarity and rendering the second transistor conductive in the source follower mode for input signals of opposite polarity.

13 Claims, 4 Drawing Figures

PROTECTION CIRCUIT FOR INSULATED-GATE FIELD-EFFECT TRANSISTORS

The invention herein was made in the course of or under a contract or subcontract thereunder with the Department of the Army.

This invention relates to protection circuits for preventing the rupture of the gate insulator of insulated-gate field-effect transistors (IGFETs).

IGFETs have an extremely high input inpedance resulting from an insulator layer placed over the conduction channel between the gate and the substrate. To operate the IGFET at practical voltage levels, the insulator layer has to be made relatively thin. However, a large potential applied across this thin insulator layer causes it to rupture, resulting in a short circuit between the gate and the substrate of the transistor, which usually is a catastrophic failure.

The application of a high voltage to the gate may occur either as a result of the application of an input signal of large amplitude or due to the accumulation of static charge on the gate. Due to the high input impedance of the device (typically, the input resistance is greater than $10^{14}$ ohms and the input capacitance is of the order of $10^{-12}$ farads) even a small static charge on the gate is translated into a high potential. Circuits containing IGFETs must be protected against electrical transients both during handling (due to build up of static charges) and after installations in electrical equipment. Applications where protection after installation is needed includes, for example, automotive applications where large transients are generated and military applications where large electromagnetic pulses are also generated. Many circuits are actually more vulnerable when installed in a system since they may be interconnected by long leads which pick up large amplitude transients from the ambient.

A variety of protection circuits have been suggested to prevent rupture of the gate insulator. One of these includes the use of one or more diodes connected in shunt across the gate-source or gate and substrate of IGFETs. A single or multi-diode protection scheme is not entirely satisfactory under all conditions. First, a high frequency transient may cause the rupture of the gate oxide before the diodes can respond. Secondly, the application of a signal and operating voltages to the IGFET circuit must be sequenced. Typically, a protection diode may be connected at its cathode to a point of positive operating voltages and at its anode to the gate of an IGFET which, in turn, is connected to a signal input terminal. A low impedance signal source applying a positive going signal to the input terminal prior to the application of, or after the removal of, the positive operating voltage causes a large current to flow through the protection diode which may burn out the diode. The destruction of the protection diode is just as catastrophic as destruction of the gate oxide of an IGFET.

Another solution is suggested in U.S. Pat. No. 3,395,290. FIG. 1 of that patent shows the combination of a diode (e.g. 23) connected between the input to the circuit and ground, and a first protecting transistor used as an input impedance means connected between the circuit input and the gate of a second transistor (e.g. 10) whose gate oxide is to be protected. Such a scheme provides some protection for the second transistor, but stress is now placed on the first transistor and on the input clamping diode.

Moreover, a positive, with respect to ground signal applied to the input of the circuit may destroy the diode, and destruction of the input diode is a catastrophic failure. Also, the circuit of the patent does not provide symmetrical protection to stressing potentials of positive and negative polarity and there is no symmetrical coupling of input signals because the protection transistor operates in the source follower mode for one polarity of input signal, and operates in the low impedance common source mode for the other polarity of input signal. Thus, the circuit has different response times depending on the polarity of the signals which is a disadvantage in both linear and digital circuitry.

Furthermore, the substrates of the protection transistors are so biased that a substantial reverse bias is developed under some signal conditions between the source and substrate of the transistor which causes its threshold voltage to increase. Consequently, the protecting transistor cuts off before it can fully discharge the potential at the gate of the protected transistor. As a result, the protected transistor may not be fully switched from one state to another. This may give rise to erroneous circuit operation and to excessive power dissipation in the protected transistor.

Protection circuits embodying the invention preferably comprise the conduction path of a first transistor of one conductivity type connected in series with a first asymmetrically conductive element between a signal input terminal and a node for connection to the gate of an IGFET to be protected, and the conduction path of a second transistor of second conductivity type connected in series with a second asymmetrically conductive device between the signed input terminal and the node. The first and second elements are poled to conduct current in opposite directions. The control electrodes of the two transistors are connected to receive first and second different bias voltages respectively, having a polarity to turn on the transistors.

In the accompanying drawings like reference characters denote like components; and FIG. 1 is a schematic diagram of a circuit embodying the invention;

In the description to follow, IGFETs of P-conductivity type are identified by the letter P followed by a particular number and IGFETs of N-conductivity type are identified by the letter N followed by a particular number.

Figure 1:
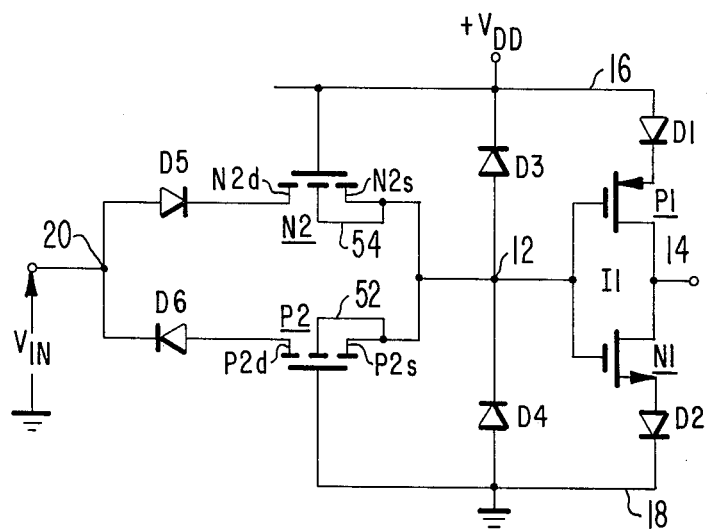

The circuit of FIG. 1 includes a complementary inverter I1 comprised of IGFET transistors P1 and N1 having their gates connected in common to an internal node 12 and having their drains connected in common to an output node 14. An offset diode D1 is connected at its cathode to the source of transistor P1 and at its anode to conductor 16 to which is applied a positive operating voltage of $+V_{DD}$ volts amplitude. An offset diode D2 is connected at its anode to the source of transistor N1 and at its cathode to ground conductor 18. A protection diode D3 connected between node 12 and conductor 16 is poled in a direction to conduct current from node 12 to terminal 16. A protection diode D4 connected between node 12 and conductor 18 is poled to conduct current from conductor 18 to node 12. Transistors P1 and N1 may have their substrates connected to their sources or their substrates may be left floating.

The protection circuit includes IGFET transistors N2 and P2 and diodes D5 and D6. Diode D5 is connected at its anode to input terminal 20 and at its cathode to the drain N2d of transistor N2. The source N2s of transistor N2 is connected to node 12 and its gate is connected to conductor 16. Transistor P2 is connected at its gate to conductor 18, at its drain P2d to the anode of diode D6. The sources and drains of transistors N2 and P2 define the ends of their conduction paths. The cathode of diode D6 is connected to input terminal 20. The substrates 52 and 54, of transistor P2 and N2, respectively, preferably are connected in common with their respective sources at node 12, rather than being connected to conductors 18 and 16, in order to minimize the reverse bias between their source and their substrate. The threshold voltage ($V_T$) of an IGFET increases with increasing reverse bias between the source and substrate. By floating the substrate or by connecting the substrate of an IGFET to its source, the $V_T$ of the transistor is maintained at a relatively low value. Transistors N2 and P2 may be formed in bulk silicon or on an insulator substrate such as sapphire.

The operation of the circuit of FIG. 1 will be examined with $+V_{DD}$ volts applied to conductor 16, ground potential applied to conductor 18 and with an input signal ($V_{IN}$) from a signal source (not shown) applied to input terminal 20.

There are two unidirectional conduction paths between node 12 and terminal 20. One path includes diode D5 and the source-drain path of transistor N2, and the other path includes diode D6 and the source-drain path of transistor P2. Diode D5 allows conventional current flow only from terminal 20 into node 12, and then only when the potential $V_{IN}$ at terminal 20 is more positive than the potential $V_{12}$ at node 12. Diode D6 allows conventional current flow only from node 12 into terminal 20. Due to diode D5, transistor N2 does not conduct when $V_{IN}$ goes more negative than $+V_{DD}$ volts and due to diode D6 transistor P2 does not conduct when $V_{IN}$ goes more positive than ground potential. Consequently, transistors N2 and P2 only conduct in the source follower mode and do not conduct in the common source mode. The bove holds as long as the potentials applied across diodes D5 and D6 do not cause them to break down in the reverse direction.

Assume that $V_{IN}$ makes a positive going transition from zero volts to $+V_{DD}$ volts and that $V_{12}$ is initially at zero volts. Transistor N2 conducts current from terminal 20 into node 12 and charges the capacitance at node 12. Hence, transistor N2 conducts in the source follower mode. Conduction takes place until $V_{12}$ reaches $+V_{DD}$ volts less $V_{TN}$ volts. Until $V_{IN}$ reaches $V_{TN}$ volts transistor N2 functions like a relatively low impedance transmission gate passing $V_{IN}$ to node 12. $V_{TN}$ is defined as the threshold voltage of transistor of N-conductivity type. The threshold voltage of a transistor is that value of gate-to-source potential ($V_{GS}$) which must be exceeded to make the transistor conduct. Since the gate potential of transistor N2 is at $+V_{DD}$ volts, its source potential cannot rise above ($V_{DD}-V_{TN}$) volts. Therefore, when $V_{12}$ reaches ($V_{DD}-V_{TN}$) volts, transistor N2 stops conducting except for leakage currents. Leakage currents flow across the reverse biased PN junctions of the transistors and the diodes. Leakage currents tend to discharge node 12 and may cause transistor N2 to keep conducting. But, the level of conduction is so low that it may be ignored. Even if $V_{IN}$ increases above ($+V_{DD} - V_{TN}$) volts, transistor N2 remains nonconducting (except for the leakage current mentioned), causing the potential at the drain of transistor N2 to rise. But, its source potential (node 12) remains fixed at ($V_{DD}-V_{TN}$) volts. Any $V_{IN}$ in excess of ($V_{DD} - V_{TN}$) volts is developed across the source-drain path of transistor N2. This is an important feature of the invention. Once node 12 is charged to $V_{DD} - V_{TN}$) volts, transistor N2 functions as an extremely high impedance (like an open switch) to the more positive input signals. Therefore, under normal operating conditions,—which may be defined as those conditions for which no potentials greatly exceeding the ratings of the devices are applied to the circuit—the gate oxides of transistors P1 and N1 are not stressed by large potentials. There are no current paths through which high currents can flow and, therefore, the circuit components are protected from burn out due to excessive power dissipation.

Assume now that $V_{IN}$ makes a negative going transition from $+V_{DD}$ volts to zero volts and that node 12 is initially at $+V_{DD}$ volts. Transistor P2 conducts current from node 12 into terminal 20. Transistor P2 conducts in the source follower mode, discharging the capacitance at node 12 through its source-drain path and diode D6. Transistor P2 conducts until $V_{12}$ decreases to a value equal to the threshold voltage ($V_{TP}$) of transistor P2. So long as $V_{IN}$ exceeds $V_{TP}$ volts, transistor P2 functions like a relatively low impedance transmission gate passing $V_{IN}$ to node 12. $V_{TP}$ is defined as the threshold voltage of transistors of P-conductivity type. When $V_{12}$ reaches $V_{TP}$ volts, transistor P2 turns off and no longer conducts (except for leakage currents which are of low value and may be ignored).

Even if $V_{IN}$ goes more negative than $V_{TP}$ volts, transistor P2 remains nonconducting (except for leakage currents) and P2 functions as an extremely high impedance (like an open switch). Under normal operating conditions, $V_{12}$ will remain at $V_{TP}$ volts as $V_{IN}$ goes more negative than $V_{TP}$ and the potential at the drain of transistor P2 follows the negative going signal. Since transistor P2 is nonconductive, substantially no current flows through its source-drain path and through diode D4. Therefore, the circuit components are protected from burn out due to excessive power dissipation and transistors P1 and N1 are protected since their gate oxides are not heavily stressed. As mentioned above, this is an extremely important feature of the invention.

When $V_{IN}$ is more negative than $V_{12}$, diode D5 is reverse biased and there is no current (except for some leakage) flowing through transistor N2 and diode D5.

Transistors N2 and P2 prevent high and unlimited surges of current to flow between terminal 12 and node 20. Under normal operating conditions, transistors N2 and P2 conduct in the source follower mode and limit the maximum potential swing at node 12 between ($V_{DD}-V_{TN}$) volts and $+V_{TP}$ volts. Furthermore, their source drain impedances limit the current surges that can flow.

With transistor N2 and P2 in the circuit, the application of the operating voltages and input signals to the circuit need not be sequenced.

Transistor N2 prevents the need for sequencing the application of the positive operating voltage and the signal source since it prevents the flow of high current surges through diode D3. For example, assume that a positive going signal is applied to terminal 20 from a low impedance source and that the positive voltage applied to conductor 16 is removed or not yet applied, so that the voltage on conductor 16 is at or near ground. Under such a bias condition, transistor N2 is either barely conducting or nonconducting and its source-drain path presents a high impedance between terminal 20 and node 12. Thus, with transistor N2 in the circuit, it is not necessary that the power supply be applied to the circuit prior to the application of signals and that the signal source be removed or disconnected prior to the removal of the power supply. Transistor N2 thus obviates the need to sequence the application of the power and signal source. (Of course, transistor P2 does not conduct under these conditions either).

In an analogous fashion, transistor P2 prevents the flow of excessive current through diode D4 in the event a positive operating voltage is applied to conductor 18 and ground or a negative potential is applied to terminal 20. Transistor P2 is rendered nonconducting by the positive voltage applied to its gate and prevents current flow through diode D4 and through its source-drain path.

Although the gates of transistors P2 and N2 are shown connected to the power supply lines, it should be appreciated that they could be connected to other points of bias potential.

Figure 2:
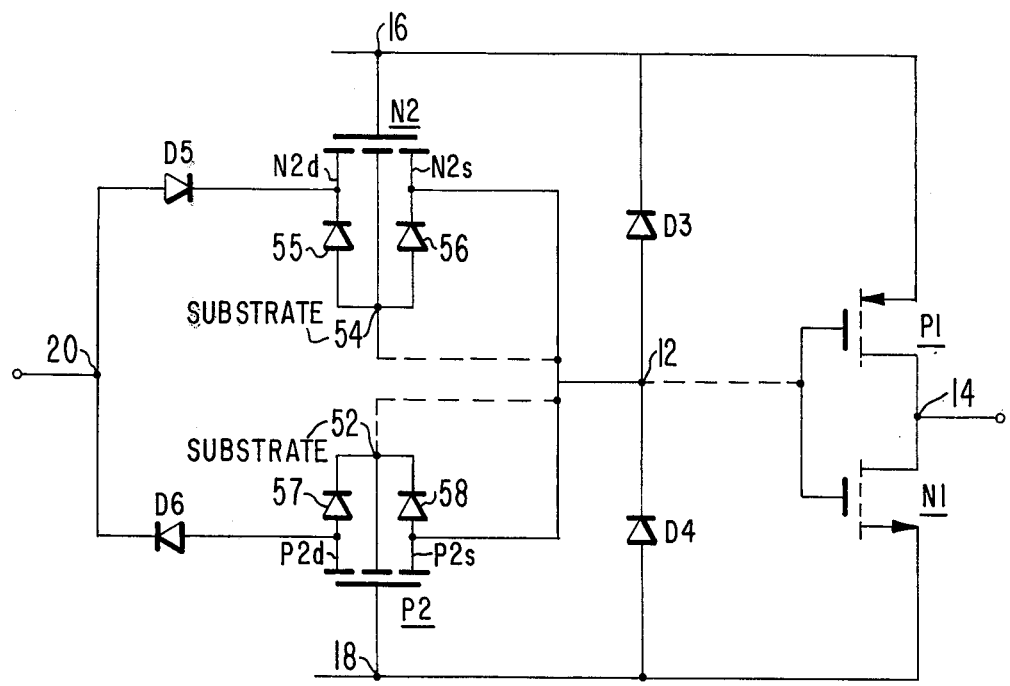
FIG. 2 is a schematic diagram detailing the PN junctions associated with the protection transistors of FIG. 1.

FIG. 2 is useful in understanding the operation of the protection circuit when potentials greatly exceeding the rating of the devices are applied to the circuit. These conditions are similar in many respects to those that exist when static charges are applied to the circuit. As shown in FIG. 2, the sources and drains of IGFETs form PN junctions (diodes) with their substrates. These junctions behave in the same general manner as typical diodes having a forward conduction characteristic and having a reverse breakdown voltage point ($V_Z$) and being capable of conducting current in the reverse direction. The junctions are designed to avalanche or breakdown in the reverse directions at potentials considerably below the gate oxide rupture point. The PN junctions formed by the drain and source of transistors N2 with its substrate 54 are represented by diodes 55 and 56, respectively. The PN junctions formed by the drain and source of transistor P2 with its substrate 52 are represented by diodes 57 and 58, respectively. The substrates 52 and 54 may be left floating or may be connected as shown by the dashed lines between the substrates and sources P2s and N2s. Junction 55, as well as all the other source/drain to substrate junctions, is designed to break down prior to the oxide rupture point. For example, where the gate oxide rupture point of the transistor of the circuit is in the range of 100 volts, the $V_Z$ of the junctions would be, typically, in the 25 to 50 volt range.

When $V_{IN}$ goes highly positive, a point is reached when the drain-to-substrate junction 55 of transistor N2 breaks down. Following the breakdown of junction 55 the potential at the substrate 54 ($V_{SUB54}$) is equal to $V_{IN}$ less the $V_Z$ of diode 55 and less the $V_{BE}$ of diode D5. If the substrate 54 is floating, diode 56 is forward biased and couples $V_{SUB54}$ less its $V_{BE}$ drop to node 12. If the substrate is directly connected to the source, then $V_{SUB54}$ is applied to node 12. Following the breakdown of diode 55, diode D3 is forward biased and clamps the positive signals at node 12 to conductor 16. The maximum positive potential applied to node 12, to which the gates of transistors N1 and P1 are connected, is $V_{IN} - V_Z$ volts. In addition, diodes D5 and 56, though forward biased, and diode 55 though in the avalanche mode, present some impedance in series with diode D3 and thus limit the maximum current surge. The combination of diodes D5 and D3 and transistor N2 prevents large positive voltage excursions at node 12, thereby protecting the gate oxides of transistors P1 and N1.

It should also be noted that the reverse breakdown of junction 55 prevents the rupture of the gate oxide of transistor N2. For when diode 55 breaks down, the potential across the channel (between gate and substrate) of transistor N2 is approximately equal to the $V_Z$ of diode 55 because of diode D3. Thus, the gate oxide of transistor N2 is protected and transistor N2 absorbs along its conduction path some of the excessive potential which would otherwise be applied to node 12.

Similarly, when $V_{IN}$ goes highly negative, a point is reached when the drain-to-substrate junction 57 of transistor P2 breaks down. When the reverse breakdown of diode 57 occurs, the potential at the substrate 52 ($V_{SUB52}$) is approximately $V_Z$ volts more positive than $V_{IN}$. If the substrate 52 is floating, diode 58 is forward biased and couples $V_{SUB52}$ plus one $V_{BE}$ drop to node 12. If the substrate is directly connected to the source, the $V_{SUB52}$ is applied to node 12. Following the breakdown of diode 57, diode D4 is forward biased and clamps node 12 to one $V_{BE}$ drop below the potential on conductor 18. The maximum negative potential stress at the gates of transistors P1 and N1 is at least $V_Z$ volts less than if transistor P2 were not present. In addition, diodes D6 and 58, though forward biased, and diode 57, though in the avalanche mode, present some impedance in series with diode D4 and thus limit the maximum current surges than can flow between terminal 20 and node 12 or conductor 18. The combination of diodes D6 and D4 and transistor P2 provides both overvoltage protection and current limiting. The reverse breakdown of diode 57 protects the gate insulator of transistor P2 from rupturing. With diode 57 operating in the reverse direction the potential across the gate insulator of transistor P2 is approximately equal to the $V_Z$ volts of diode 57 because of diode D4. Thus, the gate oxide of transistor P2 is protected and transistor P2 absorbs along its conduction path some of the excessive potential which would otherwise be applied to node 12.

In the discussion above, it has been assumed that, for positivee going signals, diode 55 breaks down before diode D6. Similarly, it has been assumed that, for negative going signals, diode 57 breaks down before diode D5. If diodes D5 and D6 break down in the reverse direction, the two conduction paths connected between node 12 and 20 may conduct current at the same time. However, the protection mechanism discussed above still controls.

The drain and source to substrate diodes of transistors P2 and N2 in combination with those of the transistors being protected also provide protection to the circuit for the static charge condition (when the circuit is being handled). Regardless of which one of the input or output terminals or which one of the conductors goes positive or negative with respect to another terminal or conductor, a conduction path exists which decreases or absorbs part of the excessive potential and which limits the maximum current surges.

It has been shown that, in circuits embodying the invention, the input signal is not applied directly to the gates of transistors P1 and N1 being protected. Instead, the input signal is applied through diodes D5 or D6 to the drains N2d or P2d of protecting transistors N2 or P2. Therefore, signals must pass through a diode and the conduction path of a transistor before being applied to the gate of a transistor. As expected from the above discussion, test results indicate that IGFETS are much less susceptible to gate oxide rupture when an excessive potential is directly applied to their drains rather than when applied to their gates.

It has also been shown that input signals of positive and negative polarity are symmetrically coupled to the internal node 12 of the circuit. Also, symmetrical protection is provided to both negative and positive stressing potentials.

It has also been shown that the gate insulators of the transistors having their gates connected to node 12 are protected against excessive voltage stresses and that the protective circuitry is protected from excessively large current surges.

The combination of transistor P2 and diode D6 in FIG. 1 can only discharge node 12 to $V_{TP}$ above ground potential, where $V_{TP}$ is the threshold voltage of transistor P2. Diode D2 is placed between the source of transistor N1 and conductor 18 to ensure that transistor N1 is cut off when $V_{IN}$ goes low, and $V_{12}$ is $V_{TP}$ volts. Diode D2 is selected so that the drop across it plus the $V_{TN}$ of transistor N1 is greater than the $V_{TP}$ of transistor P2.

Similarly, when transistor N2 conducts, it can only charge node 12 to a maximum of $(+V_{DD} - V_{TN})$ volts. Diode D1 is connected between conductor 16 and the source of transistor P1 to ensure that the gate-to-source threshold voltage of transistor P1 plus the drop across diode D1 is greater than the $V_{TN}$ of transistor N2. This ensures that transistor P1 is cutoff when the potential at node 12 goes to $(+V_{DD} - V_{TN})$ volts.

A problem with the circuit of FIG. 1 is that the maximum output voltage at node 14 cannot rise to $+V_{DD}$ volts due to the forward voltage drop of diode D1 and the minimum output at node 14 is more positive than ground potential by the forward voltage drop of diode D2. Since the potential at node 14 does not swing completely between ground and $+V_{DD}$ volts the noise immunity of the circuit is decreased and it is possible for subsequent transistors (not shown) connected to output 14 to be partially "on" when they should be off.

Figure 3:
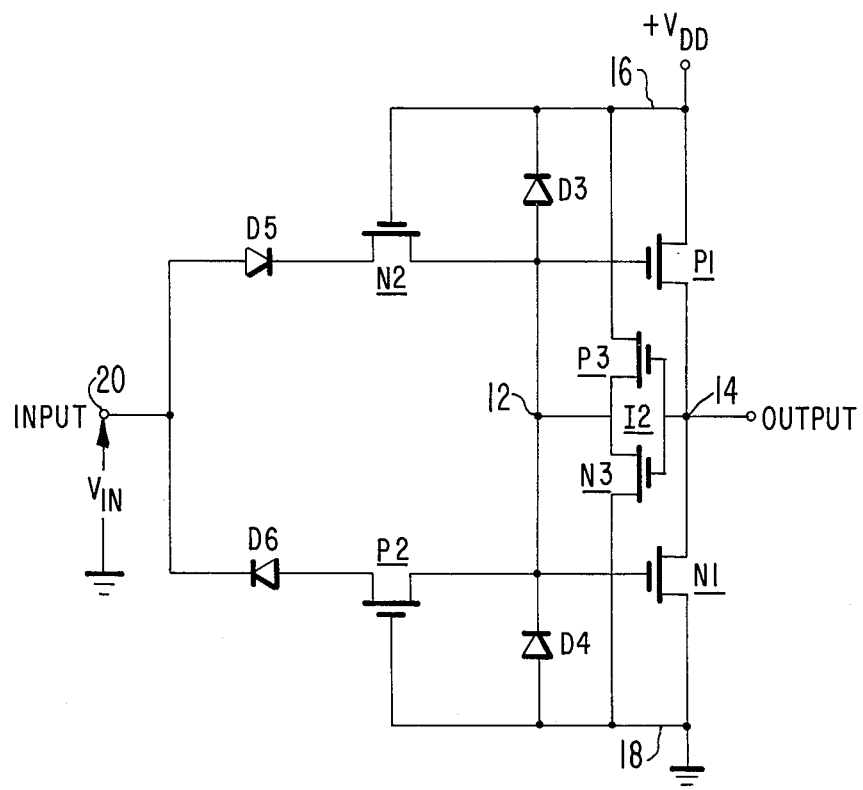
FIG. 3 is a schematic diagram of another circuit embodying the invention.

In the circuit of FIG. 3, the use of diodes D1 and D2 is obviated. Instead of the offset diodes, a second inverter I2 comprising transistors P3 and N3 is used to form a bistable stage in combination with inverter I1. Transistors P3 and N3 are connected at their gates to the output 14 of inverter I1 and at their drains to node 12. The source of transistor P3 is connected to conductor 16 and the source of transistor N3 is connected to conductor 18. Transistors P3 and N3 may be high impedance devices and may be so small that they require less space than diodes D1 and D2.

When $V_{IN}$ makes a positive going transition to $+V_{DD}$ volts, $V_{12}$ is at most equal to $V_{DD} - V_{TN}$ volts. In the absence of inverter I2, transistor N1 is full on and transistor P1 could still be conducting. The output 14 of inverter I1 would be close to zero volts but there would be a considerable amount of power dissipation due to conduction through P1. With inverter I2 present, transistor P3 conducts in the common source mode and clamps node 12 to the potential $(+V_{DD}$ volts) on conductor 16. This turns off transistor P1 and turns transistor N1 on harder. Similarly, when $V_{IN}$ goes negative, a residual $+V_{TP}$ volts is present at node 12 in the absence of I2. Transistor P1 would be full on, but transistor N1 also may be partially on. The potential at node 14 would be close to $+V_{DD}$ volts, but there would be considerable power dissipation due to conduction through transistor N1. With inverter I2 in the circuit, transistor N3 conducts in the common source mode and clamps node 12 to the potential on conductor 18 (e.g., zero volts). This maintains P1 fully on and completely turns off transistor N1. The potential at node 14 can make substantially the full swing between the potentials on power supply lines 16 and 18, and there is substantially no conduction and hence no power dissipation through the off transistors.

Figure 4:
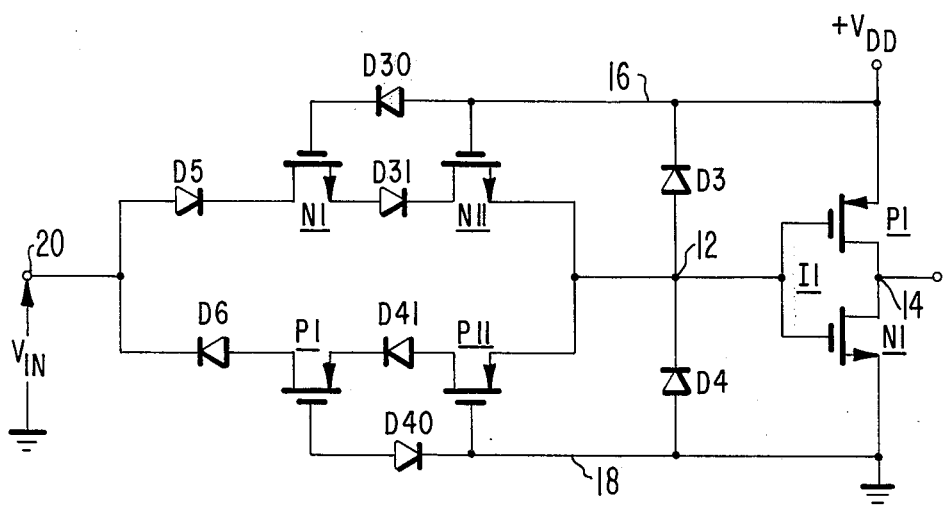
FIG. 4 is still another schematic diagram of a circuit embodying the invention.

The circuit of FIG. 4 is designed to provide greater overvoltage capability than the circuit of FIG. 1 by virtue of protection transistors connected in series. One of the current carrying paths connected between terminal 20 and node 12, includes, in addition to diode D5 and transistor N1, diode D31 connected at its anode to the source of transistor N1 and the drain-source path of transistor N11 connected between the cathode of diode D31 and node 12. The gate of transistor N11 is connected to node 16 and a diode D30 is connected at its anode to conductor 16 and at its cathode to the gate of transistors N11 and N1. The other conduction path connected between terminals 20 and 12 includes, in addition to diode D6 and transistor P1, diode D41 connected at its cathode to the source of transistor P1 and the source-drain path of transistor P11 connected between the anode of diode D41 and node 12. The gate of transistor P11 is connected to conductor 18 and a diode D40 is connected at its cathode to conductor 18 and at its anode to the gate of transistor P1. Connected to node 12 are the gate electrodes of transistor P1 and N1 to be protected.

The operation of the protection circuit is similar to that described for FIGS. 1 and 2 above. With $+V_{DD}$ volts applied to conductor 16 and ground potential applied to conductor 18, a positive going input signal causes conduction through diodes D5, the drain-source path of transistor N1, diode D31 and the drain-source path of transistor N11 to charge node 12. When $V_{In}$ approaches $(+V_{DD} - V_{TN})$ volts, conduction ceases through transistor N1 and N11 in a similar fashion to that described above. If $V_{IN}$ exceeds $V_{DD}$ volts, the excess potential less 2 $V_{BE}$ drops is developed across the drain-to-source regions of transistors N1 and N11. When $V_{IN}$ exceeds the reverse breakdown of the series combination of the drain-to-substrate diodes of transistor N1 and N11, a positive potential is coupled to node 12. Current flows through their drain-substrate and source-substrate junctions, into node 12 and through diode D3 to conductor 16. If the currents are not excessive, the diodes do not burn out and the gate-to-source potentials of transistors N1 and P1 are held at a low value. Diode D30 protects the gate oxide of transistor N1 by providing, in the reverse direction, a $V_Z$ offset between the gate of transistor N1 and conductor 16. Diode D30 ensures that the drain to substrate diodes of transistor N1 and N11 break down before the rupture point of the gate oxide of transistor N1 is reached.

In a complementary manner, a negative $V_{IN}$ causes conduction through diodes D6 and D41, and the source-drain paths of transistor P1 and P11. Current flows until node 12 is discharged close to $V_{TP}$ volts. If $V_{IN}$ becomes considerably more negative than ground, the excess potential less $2V_{BE}$ drops is developed across the source-drain paths of transistors P1 and P11. When the potential of the negative going $V_{IN}$ exceeds the reverse breakdown of the series combination of the drain to substrate diodes of transistors P1 and P11, a negative going potential is coupled to node 12. This negative going signal turns on diode D4, which clamps conductor 18 to node 12. If the currents are not excessive, the diodes will not burn out and the gate to source potentials of transistors N1 and P1 will be held at a low value.

Diode D40 performs a similar function for transistor P1 that diode D30 performs for transistor N1. That is, diode D40 ensures that the drain-to-substrate diodes of transistor P1 and P11 break down before the rupture point of the gate oxide of transistor P1 is reached.

What is claimed is:

1. A protection circuit for an insulated gate field transistor (IGFET) whose gate is connected to an input node, said protection circuit comprising:
   first and second asymmetrical devices each having a low impedance forward current direction and a high impedance reverse current direction;
   first and second transistors of first and second conductivity types, respectively, each having a conduction path and a control electrode;
   a signal input terminal;
   means connecting said first asymmetrical conducting device in series with the conduction path of said first transistor between said signal input terminal and said input node, with said first asymmetrical conducting device connected to conduct current from said signal input terminal to said input node in its low impedance direction;
   means connecting said second asymmetrical conducting device in series with the conduction path of said second transistor between said signal input path and said input node, with said second asymmetrical conducting device connected to conduct current from said input node to said input terminal in its low impedance direction; and
   means for connecting the control electrodes of said first and second transistors to first and second different bias points, respectively.

2. The protection circuit as claimed in claim 1, wherein said asymmetrical conducting means are diodes; and
   wherein said first and second transistors are IGFETs.

3. The protection circuit as claimed in claim 2, wherein said first transistor is an IGFET of N-conductivity type and said second transistor is an IGFET of P-conductivity type; and
   wherein the first of said bias points receives a relatively positive operating voltage and the second of said bias points receives a relatively negative operating voltage to bias both the first and second transistors in the on condition.

4. The protection circuit as claimed in claim 3, wherein said first IGFET is formed within a substrate of P-conductivity type and wherein said second IGFET is formed within a substrate of N-conductivity type, and wherein said substrates are connected to said input node.

5. The protection circuit as claimed in claim 3, wherein one end of the conduction path of each one of said first and second IGFETs is connected to said input node and is the source of its respective transistor and wherein the other end of the conduction path of each one of said first and second transistors is the drain of its transistor.

6. The protection circuit as claimed in claim 1, further including at least another transistor of said first conductivity type having its conduction path connected in series with the conduction path of said first transistor and said first asymmetrical conducting device;
   means connecting the control electrode of said another transistor of first conductivity type to said first bias point;
   at least another transistor of said second conductivity type having its conduction path connected in series with the conduction path of said second transistor and said second asymmetrical conducting device; and
   means connecting the control electrode of said another transistor of second conductivity type to said second bias point.

7. The protection circuit as claimed in claim 3 further including a first unidirectionally conducting element connected between the gate of said IGFET and a first point of operating potential and a second unidirectionally conducting element connected between the gate of said IGFET and a second point of operating potential.

8. The combination of:
   first and second terminals for the application therebetween of an operating potential; an input node; an output node; and a signal input terminal;
   first and second insulated-gate field-effect transistors (IGFETs) of first and second conductivity type, respectively, each IGFET having a drain and a source defining the ends of a conduction path, and a gate;
   means connecting the gates of said first and second IGFETs in common to said input node; means connecting the drains of said first and second IGFETs in common to said output node; means connecting the source of said first IGFET to said first terminal; and means connecting the source of said second IGFET to said second terminal; and
   a protection circuit comprising:
   first and second diodes;
   third and fourth IGFETs of first and second conductivity type, respectively;
   means connecting the conduction path of said third IGFET in series with said first diode between said signal input terminal and said input node;
   means connecting the conduction path of said fourth IGFET in series with said second diode between said signal input terminal and said input node; said second diode being poled in a direction opposite to said first diode; and
   means connecting the gate electrode of said fourth IGFET to said first terminal and means connecting the gate electrode of said third IGFET to said second terminal.

9. The combination as claimed in claim 8 wherein said means connecting the source of said first IGFET to said first terminal includes a first offset element; and wherein said means connecting the source of said second IGFET to said second terminal includes a second offset element.

10. The combination as claimed in claim 8 further including fifth and sixth IGFETs of said first and second conductivity type, respectively, said fifth and sixth IGFETs having their gates connected in common to said output node and having their drains connected in common to said input node; and means connecting the source of said fifth IGFET to said first terminal and the source of said sixth IGFET to said second terminal.

11. The combination as claimed in claim 10 wherein the impedances of the conduction paths of said fifth and sixth IGFETs are much greater than the impedances of the conduction paths of said first and second IGFETs for the same bias conditions.

12. The combination as claimed in claim 8 further including:
   a first additional IGFET of said second conductivity type having its conduction path connected in series with said second diode and fourth IGFET between said signal input terminal and said input node, and means connecting its control electrode to said first terminal; and
   a second additional IGFET of said first conductivity type having its conduction path connected in series with said first diode and third IGFET between said signal input terminal and said input node, and means connecting its control electrode to said second terminal.

13. The combination as claimed in claim 12:
   wherein said means connecting the control electrode of said first additional IGFET to said first terminal includes a first additional diode connected between said first terminal and said control electrode of said first additional IGFET and poled in a direction to forward bias the control electrode; and
   wherein said means connecting the control electrode of said second additional IGFET to said second terminal includes a second additional diode connected between said second terminal and the control electrode of said second additional IGFET and poled in a direction to forward bias the control electrode.

* * * * *